APPARATUS AND METHOD FOR SEPARATING A SEMICONDUCTOR WAFER

Filed May 5, 1969

INVENTORS:
IRVING LITANT,
ANTHONY J. SCAPICCHIO,

BY John R. Manning
ATTORNEYS

United States Patent Office 3,493,155

Patented Feb. 3, 1970

3,493,155

APPARATUS AND METHOD FOR SEPARATING A SEMICONDUCTOR WAFER

Irving Litant, Lexington, and Anthony J. Scapicchio, Melrose, Mass., assignors to the United States of America as represented by the Administrator of the National Aeronautics and Space Administration

Filed May 5, 1969, Ser. No. 821,586
Int. Cl. B26f *3/00*
U.S. Cl. 225—2 4 Claims

ABSTRACT OF THE DISCLOSURE

The invention relates to a method and apparatus for separating semiconductor chips whose boundaries are defined by scribe lines in a substantially flat semiconductor water. The wafer will already have been processed to contain multiple microcircuits consisting of various diffusion and dielectric layers as well as the connecting metalized lines. The scribed wafer is positioned over a convex hemisphere. Thereafter, a flexible diaphragm is caused to engage the scribed wafer and in tiny continuous increments, force the wafer against the convex hemisphere so as to separate the wafer into individual chips with a minimum of flake and dust formation. Also, the individual chips are not permitted to slide about and damage adjacent chips.

ORIGIN OF THE INVENTION

The invention described herein was made by employees of the U.S. Government and may be manufactured and used by or for the Government of the United States of America for governmental purposes without the payment of any royalties thereon or therefor.

BACKGROUND OF THE INVENTION

One of the initial steps in the formation of microcircuits, is the growing of a crystal, such as germanium or silicon, which is subsequently sliced into thin wafers. The thin wafers are then scribed by a scribing device, the lines so formed by the scribing will determine the boundaries of the individual chips which are later formed into microcircuits. As an example, the semiconductor wafers may be approximately 0.006 inch in thickness and the individual chips formed from the wafer may be of a dimension, in the case of rectangular chips, 0.040 inch by 0.070 inch. Chips of dimensions other than rectangular may be scribed on the wafer although the prior art apparatus for separating the wafer into the chips may not be capable of separating the chips defined by these unusual scribe lines.

The chip separation techniques have been a major source of yield loss which is caused principally by breaking of the chips and scratching of the chips. As an example, scribing and breaking yields of 75% have been found by visual inspection of premounted chips. Cracks, chips, and scratches, which are incipient failures may readily pass this visual observation and also later tests, only to fail in use. The difficulty arises in the inherent production of small diamond and silicon particles. In most of the present procedures for forming the chips from the wafer, there is sufficient agitation of the breaking and the already broken wafer into chips, to enable the dust particles formed during the breaking operation at the edge of a chip to scratch the surface metalization.

Prior to separating the wafer into chips, the semiconductor wafer is first scribed so as to form a grid-like pattern of lines or grooves. Thereafter, the scribed wafer is flexed in such a manner so as to separate the wafer into a plurality of chips as determined by the scribed lines or marks. Various methods have been employed in the chip breaking operation. In the past, semiconductor wafers have been cut into chips using gang saws or ultrasonic cutters. The use of gang saws has proved uneconomical due to the waste of material caused by the sawing and also by the slow speed of operation. Ultrasonic cutters are more efficient and produce less waste than gang saws but are considerably more expensive in original cost. Later, the prior art discloses a number of other ways for separating the wafer. In another method, a curved member is employed to flex the wafer after it has been scribed. When the curved member such as a cylindrical anvil or roller is employed, the wafer must be flexed first in one direction and then in the other direction, and the operator must be reasonably careful in order to minimize damage to and contamination of the chips. This operation is not entirely successful due to its slow speed of operation and contamination and damage to the chips by the flakes that are produced during the breaking operation. Other methods suggest the use of an adhesive, flexible sheet for retaining the individual chips in place after the wafer is separated. Another method requires placing the scribed wafer in a folded sheet of paper and pulling it over and down on a curved metal cylinder with the scribed surface up. Other techniques have employed plastic tapes between which wafers are pulled over two curved surfaces, adhesive tapes on which wafers are mounted and broken, and steel sheets which are flexed with wafers mounted on them.

None of the foregoing methods are truly satisfactory. In these prior art methods, the yields are low in that the chips become damaged by contact with each other or with flakes of semiconductor material resulting as the individual chips are broken at the scribed lines. The present invention overcomes the objections of the prior art in that the chips are held in place during the operation and are not permitted to slide over each other or scratch the metalized conducting lines; semiconductor flakes produced during the breaking operation are minimized and in addition can not touch the circuit pattern; and, the services of a skilled operator are eliminated.

SUMMARY OF THE INVENTION

In the present invention, an open end cylindrical chamber has positioned therein a convex hemisphere upon which a scribed semiconductor wafer is placed. A flexible diaphragm is positioned over the wafer and convex hemisphere and a second chamber is positioned over the flexible diaphragm. Fluid pressure is introduced into the upper chamber so as to force the flexible diaphragm downward and into engagement with the scribed wafer. As the pressure is progressively increased, the flexible diaphragm "walks" across the surface of the scribed wafer, the wafer being forced into engagement with the convex hemisphere. The pressure is increased until the entire wafer is broken and when the fluid pressure is terminated and the upper chamber and flexible diaphragm removed, there remains a completely broken semiconductor wafer now in the form of many chips. During the operation, the chips were not permitted to touch each other and thus cause damage. In addition, the separation of the wafer at the scribed lines was clean, clear-cut, and orderly so that little if any flakes or dust were formed. In actual practice, very high yields have been achieved.

Accordingly, it is the principal object of the present invention to improve the processes, methods, and apparatus for separating elements whose boundaries are defined by scribe lines.

It is a further object of the present invention to improve the methods and apparatus for separating semiconductor chips whose boundaries are defined by scribe lines in a substantially flat semiconductor wafer.

It is a further object of the present invention to increase the yield of semiconductor chips formed from breaking a scribed semiconductor wafer by eliminating or minimizing semiconductor flakes and dust resulting from the breaking operation and by not permitting the chips to slide over each other so as to scratch or mar other chips so formed.

It is a further object of the present invention to permit the breaking of chips from a wafer into any geometrical pattern determined by the scribed lines, the breaking being attended by a high yield and by the services of an inexperienced operator.

BRIEF DESCRIPTION OF THE DRAWINGS

The invention, both as to its organization and method of operation, together with further objects and advantages thereof, will best be understood by reference to the following specifications taken in conjunction with the accompanying drawings in which.

DESCRIPTION OF THE PREFERRED EMBODIMENT

Figure 1:
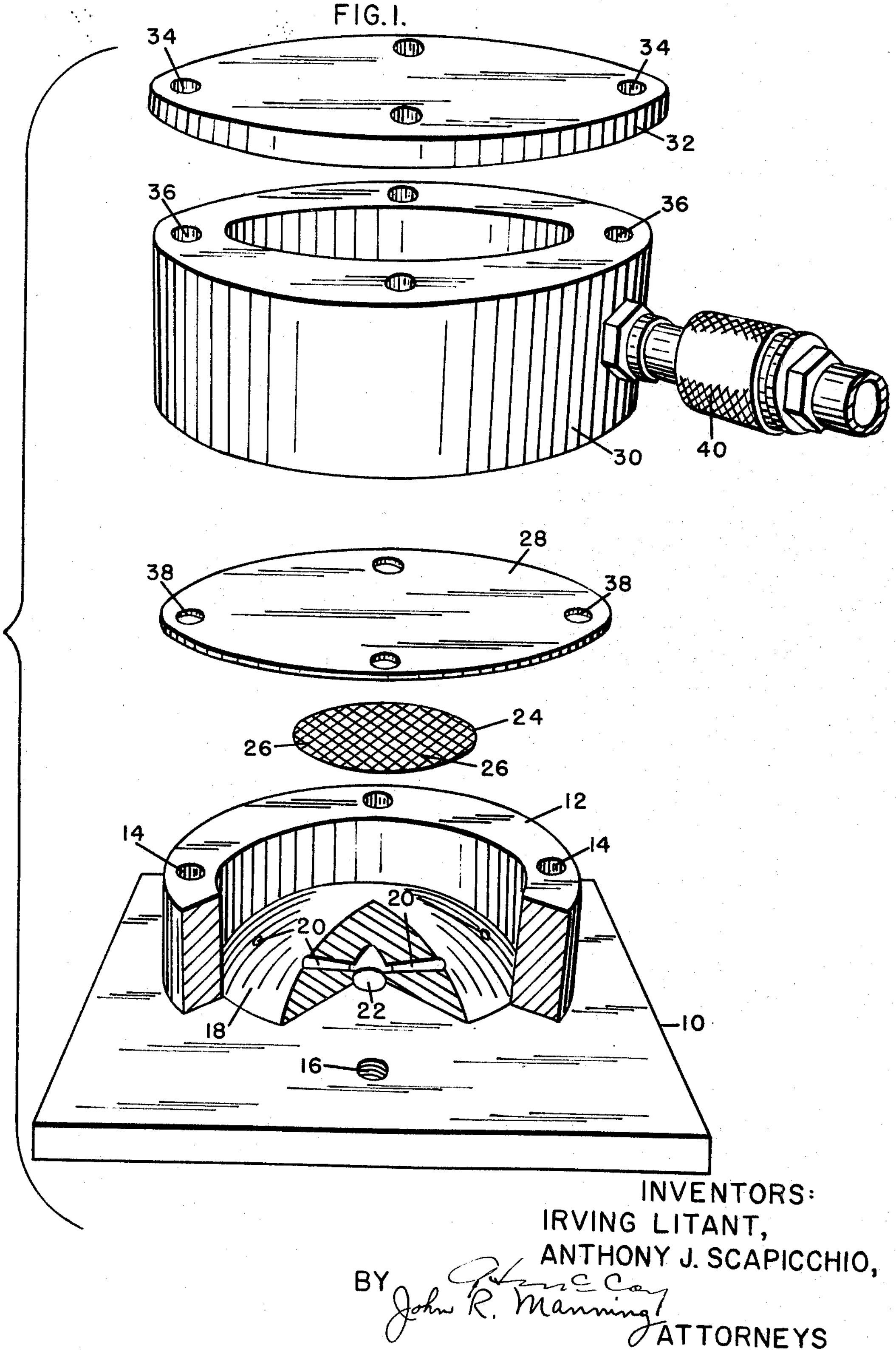
FIGURE 1 is an exploded view, with portions removed, of the apparatus for accomplishing the breaking operation.

The apparatus is shown in an exploded view in the FIGURE 1. A base member 10 of flat construction has positioned thereon a lower chamber 12. The lower chamber 12 is secured to the base member 10 by a plurality of bolts, not shown, which are inserted in a group of apertures 14 in the lower chamber 12 and apertures 16 (only one of which is shown) in the base member 10. Positioned within the lower chamber 12 and resting upon the base member 10 is a convex hemisphere 18. The hemisphere 18 is provided with a plurality of bleed holes 20 which communicate with a central aperture 22. The purpose of the bleed holes 20 is to prevent a rise in pressure above the hemisphere 18 during the breaking operation. It is over the convex hemisphere 18 that the scribed wafer is subsequently broken. One such wafer is shown at 24. The wafer 24 has scribed thereon a plurality of scribed lines 26 which are scribed in accordance with the geometrical pattern desired of the chips.

A flexible diaphragm 28 is illustrated in the FIGURE 1 above the scribed wafer 24 and below a cylindrical upper chamber 30. Above the upper chamber 30 is a top plate 32 and the top plate 32, the upper chamber 30, and the flexible diaphragm 28 have formed therein, respectively, a plurality of apertures 34, 36, and 38 which align with the apertures 14 and 16 in the lower chamber 12 and the base member 10. The bolts, not shown, securely position the entire device as a solid unit. A source of fluid pressure, not shown, is introduced into the upper chamber 30 via a conduit 40. The pressure to the upper chamber may be controlled in any suitable manner.

Figures 2, 3, 4:
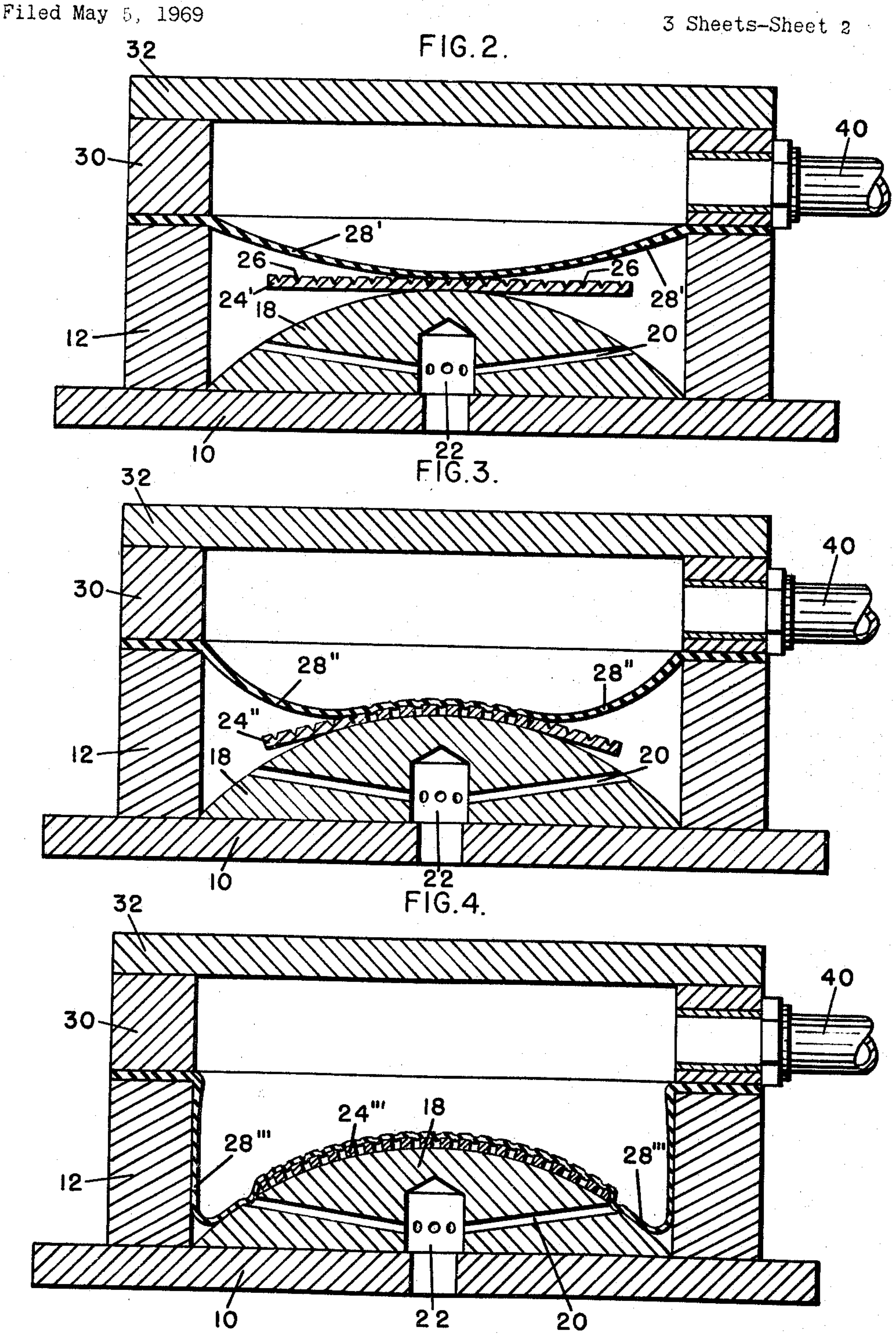
FIGURE 2 is a diagrammatic side elevational view of the apparatus and illustrating the first step of the method wherein the flexible diaphragm is just touching the wafer positioned on the convex hemisphere.
FIGURE 3 is a diagrammatic side elevational view similar to the FIGURE 2 and showing the flexible diaphragm in a more advanced position in separating the wafer.
FIGURE 4 is a diagrammatic side elevational view similar to the FIGURES 2 and 3 but illustrating the final position of the flexible diaphragm at the termination of the separating process; and, FIGURE 5 is a pictorial view of the lower chamber with a portion removed, and showing the individual chips after separation of the wafer.

The method is best illustrated in the FIGURES 2, 3, and 4. In the FIGURE 2, the flexible diaphragm indicated at 28' has been forced downward into light touching engagement with the scribed wafer indicated at 26'. The displacement of the flexible diaphragm 28' has been produced by the application of pressure through the conduit 40.

As the pressure via the conduit 40 is increased, the flexible diaphragm 28' continues to "walk" across the surface of the scribed wafer 24' and one of the intermediate positions is shown in the FIGURE 3. In the FIGURE 3, it will be noted that the central portion of the scribed wafer 24'' and an area surrounding the central portion has been parted at the scribe lines by engagement of the flexible diaphragm now indicated as 28''.

The application of fluid pressure continues through the conduit 40 until a final position is reached which is illustrated in the FIGURE 4. In this figure, the flexible diaphragm now indicated as 28''' has "walked" completely across the entire surface of the scribed wafer now designated 24'''. The entire wafer 24''' has been broken and the flexible diaphragm 28''' has continued on downward across a lower portion of the convex hemisphere 18. As the pressure was increased in the upper chamber 30 to force the flexible diaphragm 28 downwardly, any pressure built up in the lower chamber 12 was relieved through the bleed holes 20.

Figure 5:
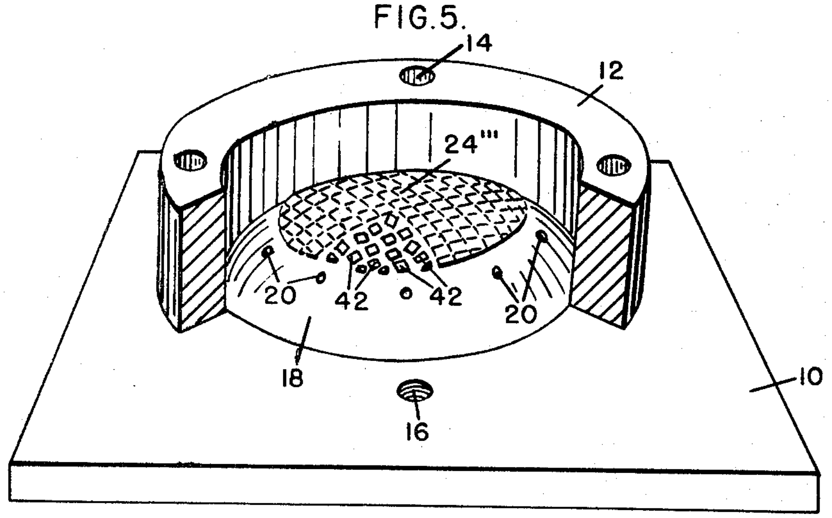

In the FIGURE 5, the flexible diaphragm 28, the upper chamber 30, and the top plate 32 have been removed so as to expose the broken wafer 24''' and the individual chips 42 which have been formed as a result of the foregoing process. Although not readily evident in the FIGURE 5, the chips 42 have been formed with little, if any, flaking or dust being formed and each chip 42 is prefectly formed and not chipped or marred in any manner. The foregoing operation can be accomplished by an unskilled operator and repeated time and again reaching yields that approach 100%.

Thus, a highly efficient, simple, and reliable method and apparatus has been disclosed for separating semiconductor wafers or wafers of other material, which have been previously scribed according to a desired pattern. The yields from such operation are extremely high in that little, if any, flaking or dust is formed during the operation, which flaking is usually deleterious to the chips. Furthermore, the individual chips have been held in position and have not been permitted to move about so as to damage themselves or adjacent chips. The process can be repeated time and again by an inexperienced operator which alleviates the need for advanced training in the practice of the process.

In an actual process which has been practiced, the wafer diameters were 1.25 inches. The radius of curvature of the hemisphere was 5.0 cm. The thickness of the flexible diaphragm was 0.018 inch. The pressure applied was 120 p.s.i. The wafer thicknesses ranged from 0.006 inch to 0.010 inch. When the wafers were properly scribed, essentially 100% breakage was achieved along the scribe lines. In addition to the usual rectangular chips, other wafers were successfully separated such as those into symmetrical triangles by scribing at the appropriate angles. The rectangular scribing produced chip sizes in the ranges of 0.040 by 0.070 to 0.070 by 0.070 inch. Smaller chip sizes would require a hemisphere having a smaller radius of curvature, the radius of curvature being easily selected by one skilled in the art.

Thus, the present invention may be embodied in other specific forms without departing from the spirit and the essential characteristics of the invention.

What is claimed is:

1. A method for separating a wafer whose boundaries are defined by scribe lines comprising the steps of positioning the wafer over a convex hemisphere, placing a resilient diaphragm over the wafer, forcing the diaphragm against the wafer so as to engage the central area of the diaphragm with the central are of the wafer, and continuing the forcing step so as to cause the diaphragm to stretch across the entire wafer so that the wafer assumes the contour of the convex surface to thereby separate the wafer at its scribe lines.

2. The method as defined in claim 1 wherein the step of forcing is by application of gas pressure to the diaphragm.

3. Apparatus for separating a wafer at its scribe lines comprising a lower chamber having an open end, a convex hemisphere positioned within said lower chamber, and upper chamber having an open end, a resilient diaphragm positioned across said open end of said upper chamber, means for forcing said diaphragm toward said convex hemisphere so that a wafer positioned between said diaphragm and said convex surface will assume the contour of said convex hemisphere, said diaphragm stretching across said wafer in a continuous motion, to thereby effect a clean and continuous separation of the wafer at its scribe lines.

4. The apparatus as defined in claim 3 including apertures formed in said convex hemisphere for preventing the buildup of gas pressure during the separation of the wafer.

References Cited

UNITED STATES PATENTS

| | | | |
|---|---|---|---|
| 2,970,730 | 2/1961 | Schwarz | 225—2 |
| 3,040,489 | 6/1962 | Costa | 225—2 X |
| 3,182,873 | 5/1965 | Kalvelage et al. | 225—2 |
| 3,396,452 | 8/1968 | Sato et al. | 225—2 X |

JAMES M. MEISTER, Primary Examiner

U.S. Cl. X.R.

225—96.5